United States Patent
Tsuchiya (10) Patent No.: US 10,050,564 B2
(45) Date of Patent: Aug. 14, 2018

(54) VIBRATION ACTUATOR AND IMAGE FORMING APPARATUS MOUNTING THE VIBRATION ACTUATOR THEREON

(71) Applicant: CANON KABUSHIKI KAISHA, Tokyo (JP)

(72) Inventor: Satoshi Tsuchiya, Inagi (JP)

(73) Assignee: Canon Kabushiki Kaisha, Tokyo (JP)

(*) Notice: Subject to any disclaimer, the term of this patent is extended or adjusted under 35 U.S.C. 154(b) by 611 days.

(21) Appl. No.: 14/681,559

(22) Filed: Apr. 8, 2015

(65) Prior Publication Data

US 2015/0295518 A1 Oct. 15, 2015

(30) Foreign Application Priority Data

Apr. 11, 2014 (JP) .................................. 2014-082001
Apr. 6, 2015 (JP) .................................. 2015-077931

(51) Int. Cl.
| | |
|---|---|
| *H01L 41/04* | (2006.01) |
| *H02N 2/00* | (2006.01) |
| *G03G 15/00* | (2006.01) |
| *H01L 41/047* | (2006.01) |
| *G03G 21/16* | (2006.01) |

(52) U.S. Cl.
CPC ......... *H02N 2/007* (2013.01); *G03G 15/5008* (2013.01); *G03G 15/6529* (2013.01); *G03G 21/1647* (2013.01); *H01L 41/0475* (2013.01); *H02N 2/0085* (2013.01); *G03G 2221/1657* (2013.01)

(58) Field of Classification Search
CPC .............................. H02N 2/007; H02N 2/0085
See application file for complete search history.

(56) References Cited

U.S. PATENT DOCUMENTS

| 5,578,887 A * | 11/1996 | Shirasaki ............... H02N 2/163 310/323.08 |
| 5,627,107 A * | 5/1997 | Howard .............. C01B 21/0728 264/272.17 |
| 6,335,297 B1* | 1/2002 | Han .................. H01L 21/28061 257/E21.2 |
| 2010/0151676 A1* | 6/2010 | Ritchie .................... C23C 16/34 438/660 |
| 2011/0053057 A1* | 3/2011 | Nozawa .................... G03F 1/46 430/5 |
| 2013/0188976 A1* | 7/2013 | Ueda ...................... G03G 15/10 399/67 |

FOREIGN PATENT DOCUMENTS

| JP | 11026894 A * | 1/1999 |
| JP | 2004-080947 A | 3/2004 |
| JP | 2009-055779 A | 3/2009 |
| JP | 4976804 B2 | 7/2012 |
| JP | 5236160 B2 | 7/2013 |

* cited by examiner

*Primary Examiner* — J. San Martin
(74) *Attorney, Agent, or Firm* — Fitzpatrick, Cella, Harper & Scinto (57) ABSTRACT

A vibration actuator, which can be stably driven and has high durability, is provided with a vibrating body having an elastic body, including a ferrous metal, and an electromechanical energy conversion device bonded to the elastic body, and a driven member frictionally contacting the vibrating body and moving relatively with respect to the vibrating body. The elastic body has a nitrided layer contacting the driven member, and the elastic body is electrically grounded without going through a nitrided layer.

17 Claims, 11 Drawing Sheets

VIBRATION ACTUATOR AND IMAGE FORMING APPARATUS MOUNTING THE VIBRATION ACTUATOR THEREON

BACKGROUND OF THE INVENTION

Field of the Invention

The present invention relates to a vibration actuator for frictionally driving a driven member by bringing the driven member into contact with a vibrating body, and an image forming apparatus mounting the vibration actuator thereon.

Description of the Related Art

Vibration actuators are put into practical use as motors for driving a driven member (hereinafter referred to as "the moving body") in various precision machines, or the like, because of their characteristics of large torque at low speed, being small and light, having high responsiveness, etc.

Figure 7:
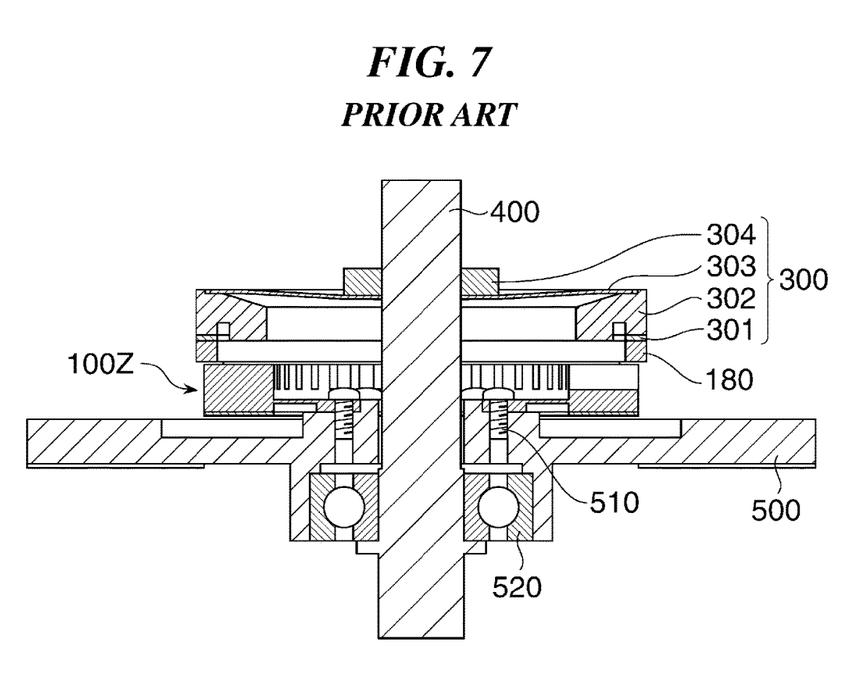
FIG. 7 is a cross-sectional view schematically showing a structure of a conventional vibration actuator.
Figure 8A:
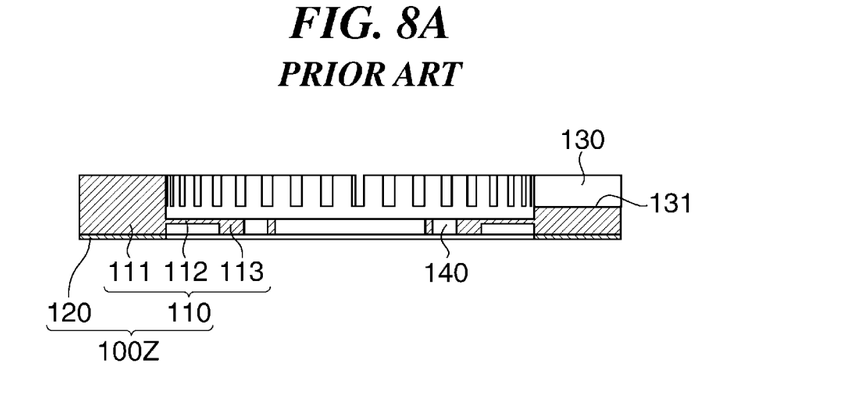
FIG. 8A is a cross-sectional view schematically showing a structure of a vibrating body constructing the conventional vibration actuator of FIG. 7.
Figure 8B:
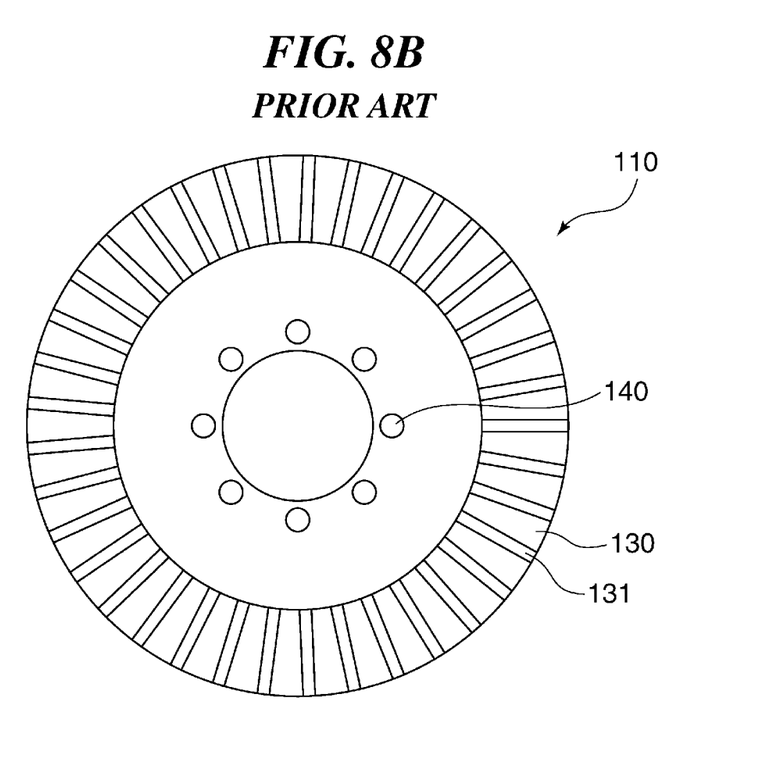
FIG. 8B is a top view schematically showing a structure of the vibrating body constructing the conventional vibration actuator of FIG. 7.
Figure 9:
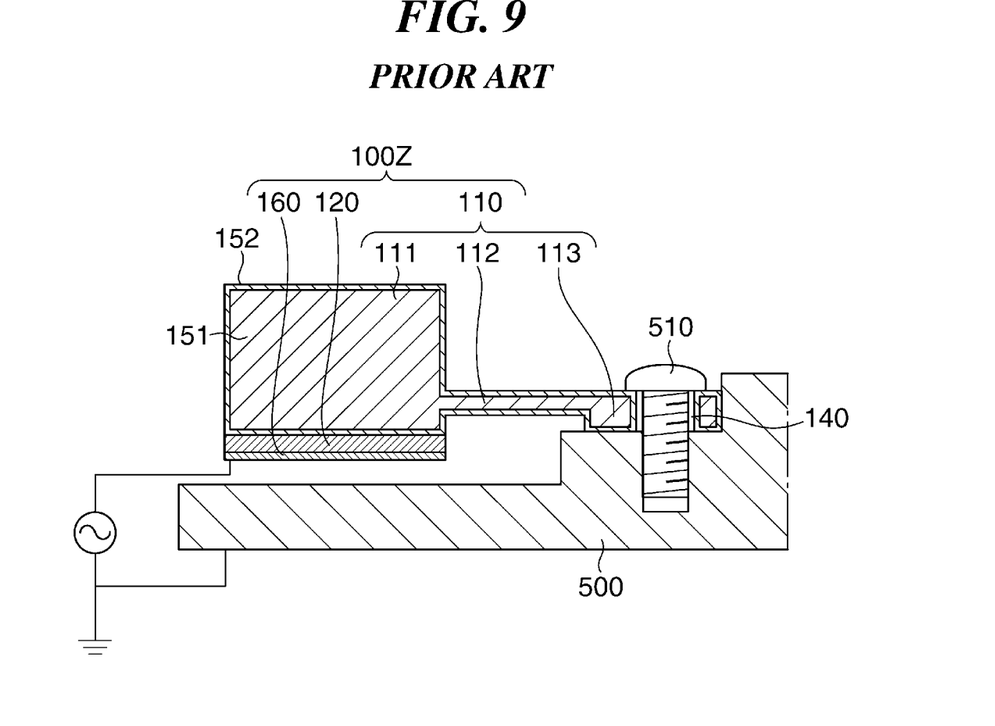
FIG. 9 is a cross-sectional view schematically showing a portion of a structure of the vibrating body and a base member constructing the conventional vibration actuator of FIG. 7.

A cross-sectional view schematically showing a structure of the conventional vibration actuator is shown in FIG. 7. Further, a cross-sectional view and a top view, schematically showing a structure of a vibrating body 100Z constructing the vibration actuator in FIG. 7, are shown in FIG. 8. Furthermore, a cross-sectional view, schematically showing a portion of a structure of the vibrating body 100Z and a base member 500 constructing the vibration actuator of FIG. 7, is shown in FIG. 9.

The vibration actuator in FIG. 7 includes a vibrating body 100Z, a moving body 180 which is a driven member that frictionally contacts to the vibrating body 100Z, a pressurization mechanism 300 that brings the moving body 180 into pressure contact to the vibrating body 100Z to output rotation of the moving body 180, and a shaft 400.

In FIG. 7, the vibrating body 100Z, the moving body 180, and the pressurization mechanism 300, each of which has a circular shape, are attached to a base member 500 with the shaft 400 as a central axis.

The pressurization mechanism 300 comprises a damping rubber 301, a pressurization spring retaining member 302, a pressurization spring 303, and a pressurization spring fixing member 304. The base member 500 includes a bearing 520.

As shown in FIG. 8 and FIG. 9, the vibrating body 100Z has an elastic body 110, a piezoelectric device 120 which is bonded as an electro-mechanical energy conversion device to the elastic body 110, and a flexible printed board 160 for applying an AC voltage as a driving voltage to the piezoelectric device 120.

The elastic body 110 has a structure in which an attachment portion 113, a connection portion 112, and a vibration portion 111 are integrally formed from an inner diameter side toward an outer diameter side, wherein the connection portion 112 supports the vibration portion 111 on the basis of the attachment portion 113.

The elastic body 110 is fixed to the base member 500, by a fixing screw 510, through a fixing hole 140 provided at the attachment portion 113.

The vibration portion 111 has a plurality of grooves 131 which are formed in a circumferential direction at regular intervals and extend in a radial direction, that is, a radial direction of the vibrating body 100Z, and has a plurality of protrusions 130 for expanding vibration displacement, which are formed by the plurality of grooves 131.

The attachment portion 113 is a portion for fixing the vibrating body 100Z to the base member 500.

As shown in FIG. 9, by the flexible printed board 160 bonded to a face of the piezoelectric device 120 opposite to a face to which the vibrating body 100Z is bonded, an AC voltage is applied to the piezoelectric device 120. By this means, in the vibrating body 100Z, flexural vibration with a predetermined order m (where m is a natural number) is excited as driving vibration, and the moving body 180 is frictionally driven and rotated by motion (including circular motion and elliptic motion) caused at a portion contacting to the moving body 180, of the vibrating body 100Z.

It should be noted that, as is clear from FIG. 7, a shaft 400 (not shown in FIG. 9) is located at an inner diameter side of the base member 500 in FIG. 9.

A structure has been proposed where a base material (a material) comprises ferrous metal such as stainless steel, and, as shown in FIG. 9, a nitrided layer 152 is formed on a contact face (a friction face) of the elastic body 110, contacting with the moving body 180 (see Japanese Laid-Open Patent Publication (Kokai) No. 2004-80947, Japanese Laid-Open Patent Publication (Kokai) No. 2009-55779, Japanese Patent No. 4976804, and Japanese Patent No. 5236160, for example). The nitrided layer 152 formed on the contact face improves abrasion resistance to the moving body, and contributes to improvement of durability of the vibration actuator.

However, when the surface of the elastic body 110 is subjected to nitriding treatment, a nitrided layer 152 which has unstable conductive property is also formed at a portion other than the contact face contacting with the moving body 180. In this case, a driving voltage to be applied to the piezoelectric device 120 is not stable; and hence, a problem that drive performance of the vibration actuator may become unstable occurs.

SUMMARY OF THE INVENTION

In an aspect of the invention, there is provided a vibration actuator comprising a vibrating body having an elastic body, including a ferrous metal, and an electro-mechanical energy conversion device bonded to the elastic body, and a driven member frictionally contacting the vibrating body and moving relatively with respect to the vibrating body, wherein the elastic body has a nitrided layer contacting the driven member, and the elastic body is electrically grounded without going through the nitrided layer.

Further features of the present invention will become apparent from the following description of exemplary embodiments with reference to the attached drawings.

DESCRIPTION OF THE EMBODIMENTS

Hereafter, embodiments according to the present invention will be described in detail with reference to the drawings.

A vibration actuator according to the present invention includes, as with the conventional vibration actuator shown in FIG. 7, a vibrating body, a moving body moving relatively with respect to the vibrating body while frictionally contacting the vibrating body, a pressurization mechanism bringing the moving body into pressure contact with the vibrating body to output rotation of the moving body, and a shaft.

The overall structure of the vibration actuator according to the present invention is equivalent to that of the conventional vibration actuator shown in FIG. 7, while the vibration actuator according to the present invention mainly differs from the conventional vibration actuator shown in FIG. 7 in three points: a structure of the vibrating body; a way to fix the vibrating body to the base member; and a way to fix a piezoelectric device to the vibrating body.

In the following description, a structure of the vibrating body and components around the vibrating body are shown so as to correspond to those of FIG. 9, while the overall structure of the vibration actuator according to the present invention is not shown.

According to the present invention, it is possible to ground the elastic body without through a nitrided layer having unstable conductive property, while improving, by the nitrided layer, abrasion resistance of a contact face of the elastic body, contacting to the moving body. By this means, it is possible to stably apply a driving voltage to the piezoelectric device, which makes it possible to stably drive the vibration actuator. Further, according to the present invention, it is possible to improve durability of the vibration actuator, which makes it possible to provide an image forming apparatus mounting the above mentioned vibration actuator thereon, which stably drives and has high durability.

First Embodiment

Figure 1:
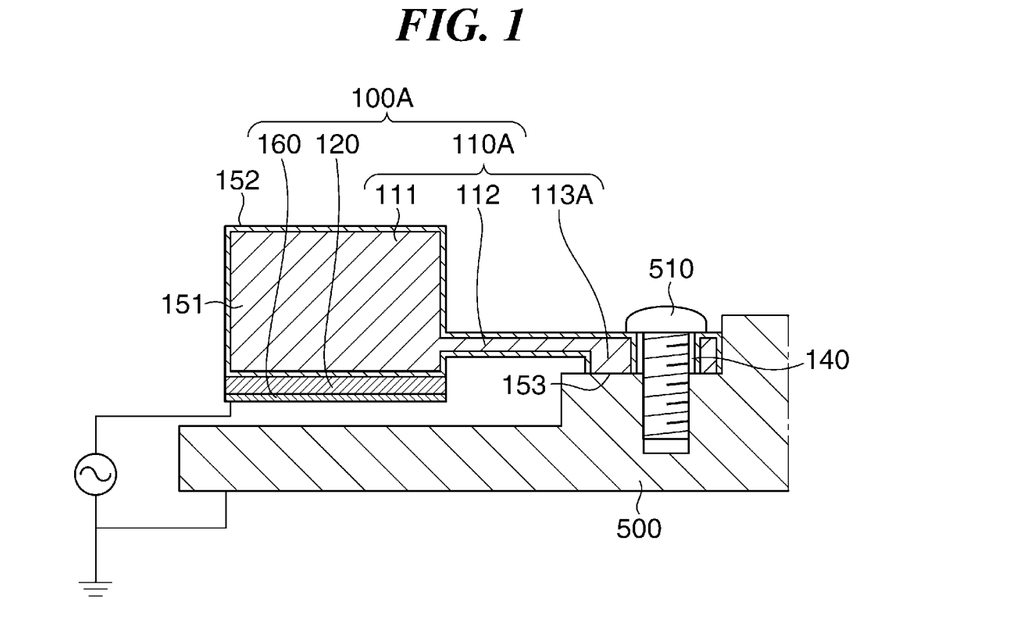
FIG. 1 is a cross-sectional view schematically showing a portion of a structure of a vibrating body and a base member constructing a vibration actuator according to an embodiment of the present invention.

FIG. 1 is a cross-sectional view showing a portion of structure of a vibrating body 100A constructing the vibration actuator according to the embodiment of the present invention and a form in which the vibrating body 100A is fixed to a base member 500.

Components of the vibrating body 100A equivalent to components of the vibrating body 100Z of FIG. 9 will be described with the same reference numerals being assigned.

The vibrating body 100A has a piezoelectric device 120 which is provided as an electro-mechanical energy conversion device, a flexible printed board 160 for applying an AC voltage as a driving voltage to the piezoelectric device 120, and an elastic body 110A to which the piezoelectric device 120 is bonded.

The elastic body 110A comprises a vibration portion 111, a connection portion 112, and an attachment portion 113A, which are integrally formed with a base material 151 which comprises a ferrous metal such as stainless steel. It should be noted that "comprises a ferrous metal" means that iron is contained in such an amount that iron functions as a main component.

Further, the vibration portion 111 and the connection portion 112 are respectively the same as the corresponding portions of the elastic body 110 of the vibrating body 100Z described with reference to FIG. 8 and FIG. 9. On a surface of the base material 151, a nitrided layer 152 having a thickness of tens of μm is formed by the surface of the base material 151 being subjected to nitriding treatment.

The vibrating body 100A is fixed to the base member 500 by a fixing screw 510, which is inserted into a fixing hole 140 provided as a through-hole, being screwed and fixed (being screwed) into a hole portion provided on the base member 500. It should be noted that the fixing screw 510 may be fixed into the hole portion provided on the base member 500 through fitting.

The base member 500 is the same as the base member 500 described with reference to FIG. 7 and FIG. 9, that is, the base member 500 comprises, a conductive material such as a ferrous material, an aluminum material, etc. It should be noted that the "aluminum material" means a material containing aluminum in such an amount that aluminum functions as a main component.

A contact face of the attachment portion 113A of the elastic body 110A, contacting to the base member 500 is a non-nitrided face 153, where a nitrided layer 152 is not formed; accordingly, a non-nitrided portion of ferrous metal (ferrous metallic base) of the base material 151 is exposed. Therefore, because the base material 151 directly contacts to the base member 500 at the non-nitrided face 153, favorable conductive property is secured between the base material 151 and the base member 500. In the description, a non-nitrided portion is a portion which is not a subject of nitriding treatment for forming a nitride layer (the nitride layer 152 in this embodiment). Therefore, the description of "non-nitrided portion" does not exclude, as long as the characteristics of the ferrous metal do not substantially change, a nitrided portion which was nitrided during processes other than the nitriding treatment.

For forming the non-nitrided face 153 on the contact face of the attachment portion 113A, contacting with the base member 500, one method can be used, in which a portion to be the non-nitrided face 153 is masked by a masking member during a nitriding treatment of the elastic body 110A (base material 151) so that a nitrided layer 152 is not formed thereat. Further, other than the above-described method, another method also can be used, in which after the nitriding treatment is performed on a whole surface of the elastic body 110A (base material 151), a nitrided layer 152 at the portion to be the non-nitrided face 153 is removed by polishing so that the non-nitrided portion of ferrous metal of the base material 151 is exposed.

A piezoelectric device 120 for exciting driving vibration on the vibration portion 111 is bonded to the vibration portion 111 of the elastic body 110A at bonded face. On another bonded face of the piezoelectric device 120, bonded to the flexible printed board 160, which is opposite to the bonded face bonded to the elastic body 110A, a driving electrode (not shown) for exciting driving vibration is formed. Meanwhile, on the bonded face of the piezoelectric device 120 bonded to the elastic body 110A, a common electrode (not shown) is formed. An AC voltage is applied, as a driving voltage, from an electrode terminal (not shown) of the flexible printed board 160 to the driving electrode of the piezoelectric device 120, to thereby cause predetermined vibration at the piezoelectric device 120 and excite driving vibration at the vibrating body 100A.

The elastic body 110A is electrically grounded through the base member 500, and a non-nitrided face 153 is formed on a contact face of the elastic body 110A, contacting with the base member 500. In other words, the elastic body 110A is grounded without going through the nitrided layer 152 and causing an unstable conductive property. Therefore, it is possible to cause stable vibration at the piezoelectric device 120, which enables to excite stable driving vibration at the vibration portion 111, which stabilizes drive performance of the vibration actuator.

It should be noted that unstable conductive property means a state where there is a portion with low conductivity. One of the reasons why the nitrided layer 152 has unstable conductive property is that the nitrided layer 152 exhibits material characteristics of ceramics having low conductivity.

Specifically, as the nitrided layer 152 becomes thicker, the conductive property of the nitrided layer 152 becomes more unstable. When a compound layer having low conductivity, which mainly contains $Fe_{2-3}N$, $Fe_4N$, etc., is formed in a vicinity of a surface layer of the nitrided layer 152, the conductive property of the nitrided layer 152 becomes significantly unstable.

Further, another reason why the nitrided layer 152 has unstable conductive property is that because the nitrided layer 152 has high surface roughness and high surface hardness, a contact area where the nitrided layer 152 contacts the base member 500 becomes small.

For the above-described reasons, in a structure where the elastic body 110 of the vibrating body 100Z is grounded through the nitrided layer 152 as shown in FIG. 9, electrical charge generated at the elastic body 110 is less likely to be released to the base member 500 due to static electricity and friction. Accordingly, the driving voltage to be applied to the piezoelectric device 120 becomes unstable, which may result in unstable drive performance of the vibration actuator.

In the first embodiment, as described above, because the base material 151 of the elastic body 110A is brought into direct contact to the base member 500 at the non-nitrided face 153, electrical charge generated at the elastic body 110A is more likely to be released to the base member 500, which makes it possible to stably apply a driving voltage to the piezoelectric device 120, and thus, it is possible to stably drive the vibration actuator. Further, with this arrangement, it is possible to realize a vibration actuator having high durability.

Second Embodiment

To make drive performance of the vibration actuator more stable, it is preferable to stabilize bondability between the elastic body 110A and the piezoelectric device 120. This is because that when the nitrided layer 152 is formed on a contact face of the elastic body 110 contacting to the piezoelectric device 120, the bondability may not be stable depending on composition of the nitrided layer 152, a bonding way, or the like.

The vibrating body 100A for addressing this problem, particularly, the variation of the elastic body 110A will be described.

Figure 2:
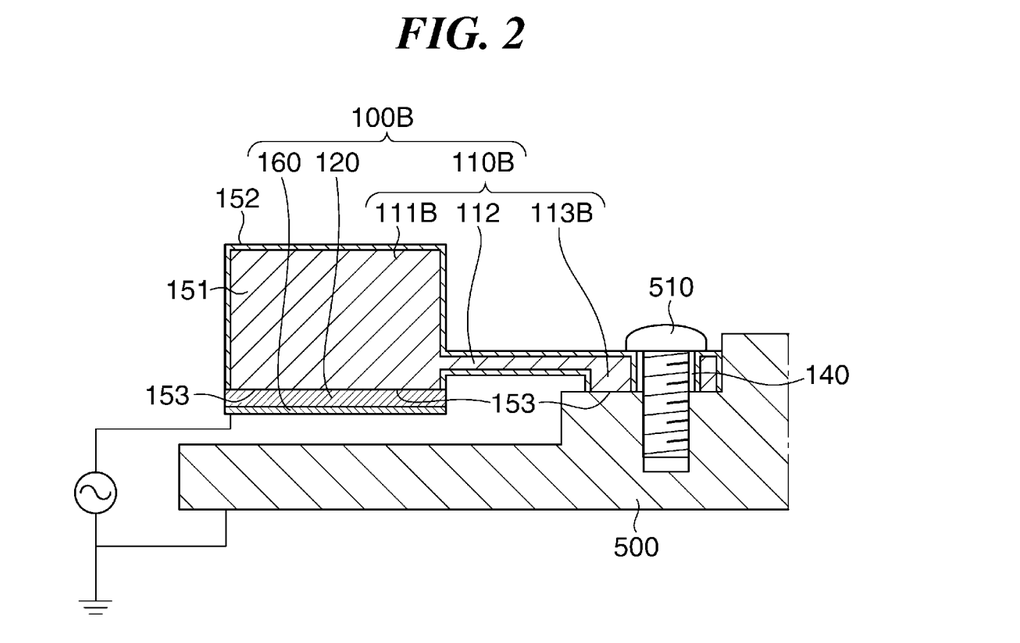
FIG. 2 is a cross-sectional view schematically showing a portion of a structure of a first variation of the vibrating body shown in FIG. 1 and a form in which the vibrating body according to the first variation is fixed to the base member.

FIG. 2 is a cross-sectional view showing a portion of a structure of a vibrating body 100B as a first variation of the vibrating body 100A of FIG. 1, and a form in which the vibrating body 100B is fixed to the base member 500. The elastic body 110B constructing the vibrating body 100B is a first variation of the elastic body 110A of FIG. 1.

A contact face of the elastic body 110B contacting the piezoelectric device 120 is a non-nitrided face 153, where a non-nitrided portion of ferrous metal of the base material 151 is exposed to the piezoelectric device 120. Therefore, because the base material 151 directly contacts the piezoelectric device 120 through the non-nitrided face 153, it is possible to stabilize bondability between the common electrode of the piezoelectric device 120 and the base material 151 of the elastic body 110B, to thereby stabilize driving voltage of the piezoelectric device 120 makes it possible to stably drive the vibration actuator.

It should be noted that the above-described two non-nitrided faces 153 of the elastic body 110B are on a single plane. Therefore, these non-nitrided faces 153 can be easily formed by a method in which portions to be the non-nitrided faces 153 are masked on one flat plate during nitriding treatment of the elastic body 110B (base material 151), or a method in which the portions to be the two non-nitrided faces 153 are polished at the same time after nitriding treatment so as to remove the nitrided layer.

When a contact face contacting to the piezoelectric device 120 is formed as the non-nitrided face 153 as in the elastic body 110B, if a method in which the contact face contacting to the piezoelectric device 120 is masked is employed, the amount of deformation of the elastic body 110B due to nitriding treatment becomes large, which may make it difficult to secure dimension accuracy. This is due to surface expansion caused when the nitrided layer 152 is formed on a surface of the base material 151 comprising a ferrous metal. By decreasing dimension accuracy, drive performance of the vibration actuator may become unstable.

Therefore, as with the structure of the elastic body 110 shown in FIG. 8, it is preferable that the bottom of the grooves 131 is made a non-nitrided face by forming, in a circumferential direction, a plurality of grooves 131 and protrusions 130 extending in a radial direction, that is, in a radial direction of the vibrating body 100B, on a friction face of the elastic body 110B, which contacts the moving body 180. By this means, it is possible to suppress the deformation of the elastic body 110B due to the nitriding treatment.

In this case, while a nitrided layer is formed at the each protrusion 130, because the surface expansion caused by the nitriding treatment is absorbed in the grooves 131, the deformation of the elastic body 110 is suppressed. As a method for making the bottom of the grooves 131 a non-nitrided face, a method in which the bottom of the grooves 131 is masked during the nitriding treatment or a method in which the bottom of the grooves 131 is polished after the nitriding treatment, may be used. Further, if ion nitriding treatment is performed as the nitriding treatment, ions are less likely to reach the bottom of the grooves 131 by reducing width dimension of the grooves 131 and/or increasing depth of the grooves 131, which makes it possible to form a non-nitrided face at the bottom of the grooves 131.

It should be noted that while the protrusions 130, each of which is formed between the grooves 131 where the non-nitrided face is formed at the bottom, are formed in order to suppress deformation due to the nitriding treatment. The protrusions 130 may be used to increase vibration displacement as with the elastic body 110 described with reference to FIG. 8.

Third Embodiment

Figure 3A:
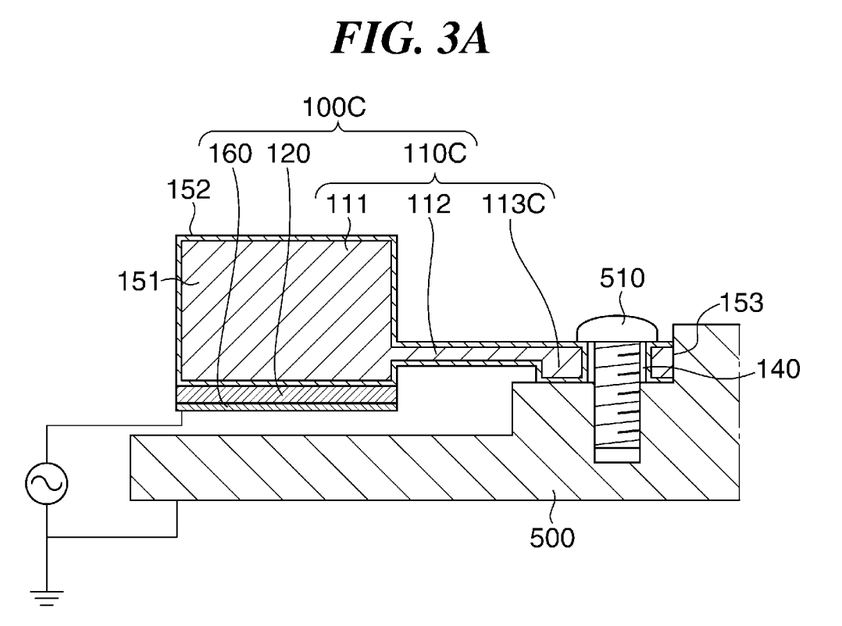
FIG. 3A is a cross-sectional view schematically showing a portion of a structure of a second variation of the vibrating body shown in FIG. 1, and a form in which the vibrating body according to the second variation is fixed to the base member.

FIG. 3A is a cross-sectional view showing a portion of a structure of a vibrating body 100C as a second variation of the vibrating body 100A of FIG. 1, and a form in which the vibrating body 100C is fixed to the base member 500. The elastic body 110C constructing the vibrating body 100C is a second variation of the elastic body 110A of FIG. 1.

In the elastic body 110C, a lateral face at the inner diameter side (inner diameter face), which is a contact face of the attachment portion 113C contacting to the base member 500, is a non-nitrided face 153, where the base material 151 is exposed. Therefore, because the base material 151 directly contacts to the base member 500 at the non-nitrided face 153, the elastic body 110C provides the same advantages as those of the elastic body 110A shown in FIG. 1.

It should be noted that the non-nitrided face 153 of the elastic body 110C (base material 151) can be formed by a method in which the inner diameter face of the elastic body 110C is masked during the nitriding treatment of the elastic body 110C, a method in which the inner diameter face of the elastic body 110C is polished after the nitriding treatment so as to remove a nitrided layer, or a method in which hole drilling for forming the inner diameter face of the elastic body 110C is performed after nitriding treatment of the elastic body 110C.

Figure 3B:
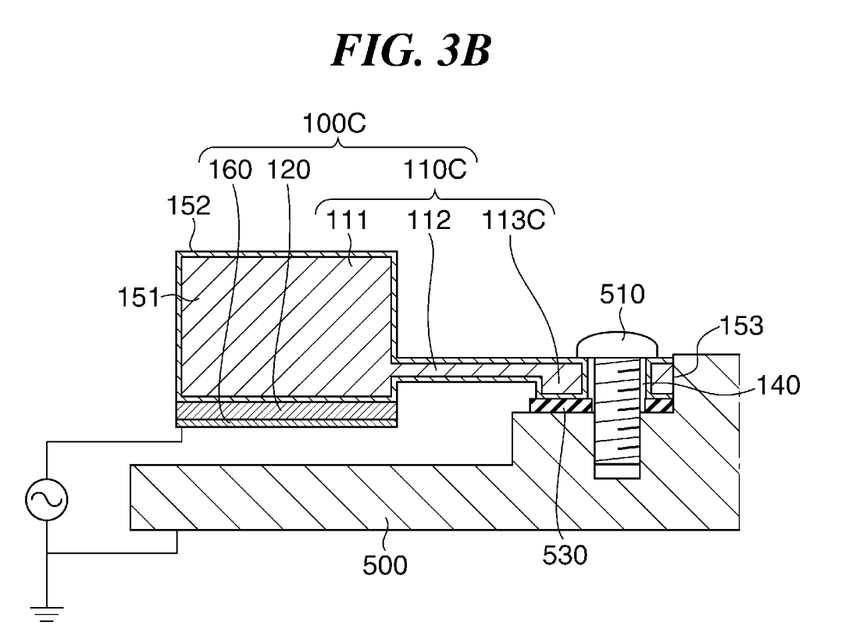
FIG. 3B is a cross-sectional view showing another example of the form of FIG. 3A, in which the vibrating body is fixed to the base member.

FIG. 3B is a cross-sectional view showing another form in which the vibrating body 100C of FIG. 3A is attached to the base member 500.

In FIG. 3A, the vibrating body 100C is attached to the base member 500 by way of the fixing screw 510 so that a lower face of the attachment portion 113C of the elastic body 110C directly attaches to the base member 500. On the other hand, in FIG. 3B, a rubber member 530 is disposed, as an elastic member for damping unnecessary vibration caused at the vibrating body 100C, between the attachment portion 113C of the vibrating body 100C and the base member 500.

Even with such a structure, the elastic body 110C (base material 151) is conducted to the base member 500 through the non-nitrided face 153 with small electrical resistance, which makes it possible to reliably ground the elastic body 110C without going through the nitrided layer 152.

Fourth Embodiment

Figure 4A:
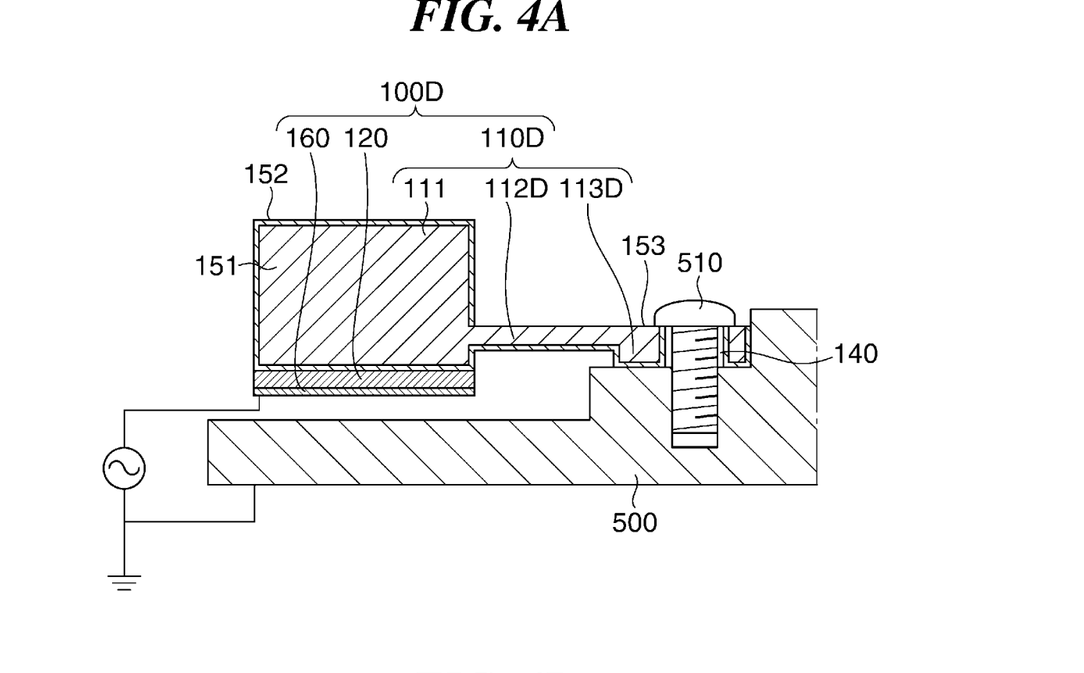
FIG. 4A is a cross-sectional view schematically showing a portion of a structure of a third variation of the vibrating body shown in FIG. 1, and a form in which the vibrating body according to the third variation is fixed to the base member.

FIG. 4A is a cross-sectional view showing a portion of a structure of a vibrating body 100D as a third variation of the vibrating body 100A of FIG. 1, and a form in which the vibrating body 100D is fixed to the base member 500. The elastic body 110D constructing the vibrating body 100D is a third variation of the elastic body 110A of FIG. 1.

In the elastic body 110D, a top face of the connection portion 112D and the attachment portion 113D, that is, a face opposite to a face facing to the base member 500, is a non-nitrided face 153, where the base material 151 is exposed.

Here, the fixing screw 510 for fixing the vibrating body 100D to the base member 500 comprises a conductive material such as a ferrous material and an aluminum material, and directly contacts to the top face of the attachment portion 113D. Further, a body portion of the fixing screw 510 directly contacts with a wall face of a hole portion formed at the base member 500.

Therefore, the elastic body 110D (base material 151) is conducted to the base member 500 through the non-nitrided face 153 and the fixing screw 510 with small electrical resistance. By this means, the elastic body 110D provides the same advantages as those of the elastic body 110A shown in FIG. 1.

It should be noted that in terms of the base material 151 being conducted to the base member 500, in the elastic body 110D, it is only necessary to form a non-nitrided face 153 on at least the top face of the attachment portion 113D, where the base material 151 is exposed. The non-nitrided face 153 of the elastic body 110D can be formed by a method in which the top face of the connection portion 112D and the attachment portion 113D is masked during the nitriding treatment of the elastic body 110D (base material 151), a method in which the top face of the connection portion 112D and the attachment portion 113D is polished after the nitriding treatment so as to remove a nitrided layer, or the like.

Figure 4B:
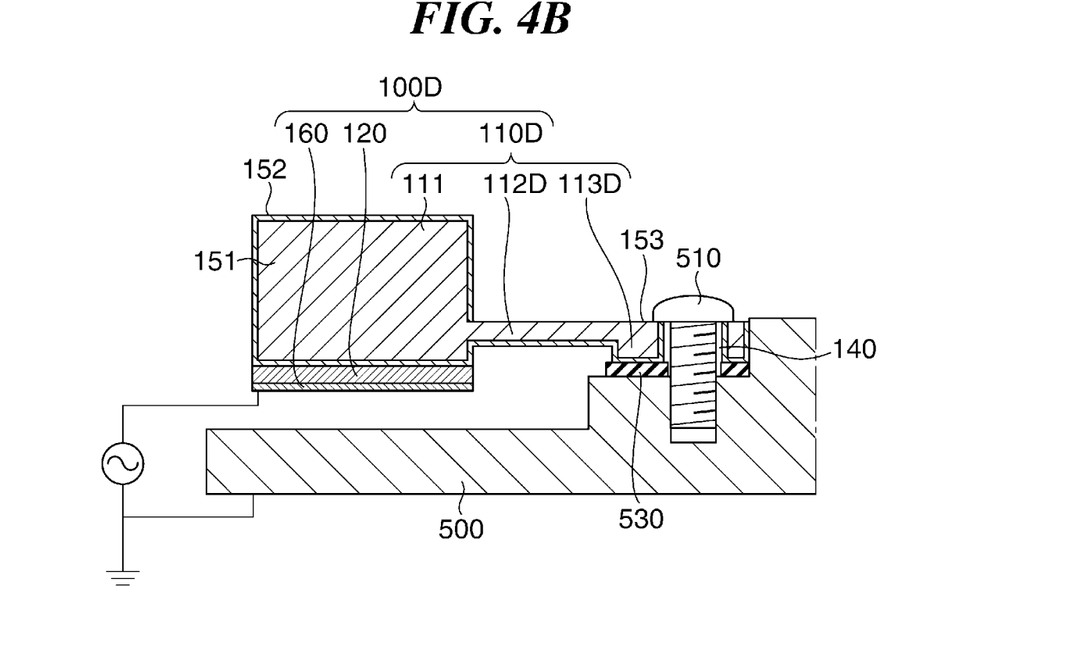
FIG. 4B is a cross-sectional view showing another example of the form of FIG. 4A, in which the vibrating body is fixed to the base member.

FIG. 4B is a cross-sectional view showing another form in which the vibrating body 100D of FIG. 4A is fixed to the base member 500.

In FIG. 4A, the vibrating body 100D is attached to the base member 500 by way of the fixing screw 510 so that a lower face of the attachment portion 113D of the elastic body 110D directly contacts to the base member 500. On the other hand, in FIG. 4B, a rubber member 530 is disposed, as an elastic member for damping unnecessary vibration caused at the vibrating body 100D, between the attachment portion 113D of the vibrating body 100D and the base member 500.

Even with such a structure, the elastic body 110D (base material 151) is conducted to the base member 500 through the non-nitrided face 153 and the fixing screw 510 with small electrical resistance, which makes it possible to reliably ground the elastic body 110D without going through the nitrided layer 152.

Fifth Embodiment

Figure 5:
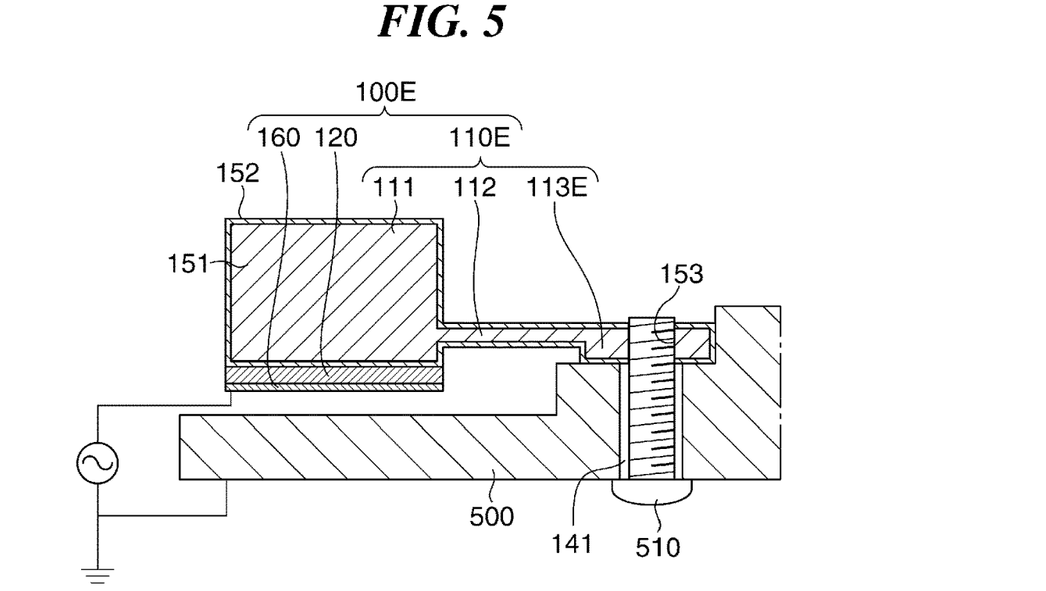
FIG. 5 is a cross-sectional view schematically showing a portion of a structure of a fourth variation of the vibrating body shown in FIG. 1, and a form in which the vibrating body according to the fourth variation is attached to the base member.

FIG. 5 is a cross-sectional view showing a portion of a structure of the vibrating body 100E as a fourth variation of the vibrating body 100A of FIG. 1, and a form in which the vibrating body 100E is fixed to the base member 500. The elastic body 110E constructing the vibrating body 100E is a fourth variation of the elastic body 110A of FIG. 1.

In the elastic body 110A, a fixing hole 140 is provided as a through-hole, through which the fixing screw 510 is inserted, at the attachment portion 113. On the other hand, a screw hole, into which the fixing screw 510 is screwed, is formed at the attachment portion 113E of the elastic body 110E, and a wall face of the screw hole is formed as a non-nitrided face 153. In accordance with this, a fixing hole 141 is formed at the base member 500, for guiding a body portion of the fixing screw 510 to the hole portion of the elastic body 110E.

Therefore, the elastic body 110E (base material 151) is conducted to the base member 500 through the non-nitrided face 153 and the fixing screw 510 with small electrical resistance, which makes it possible to reliably ground the elastic body 110E, therefore, the elastic body 110E provides the same advantages as those of the elastic body 110A shown in FIG. 1. The hole portion having a wall face formed as the non-nitrided face 153, can be formed by a method in which after a hole portion is formed prior to the nitriding treatment of the elastic body 110E, the wall face of the hole portion is masked during the nitriding treatment, a method in which a hole drilling is performed after nitriding processing of the elastic body 110E (base material 151), or the like.

Sixth Embodiment

Figure 6:
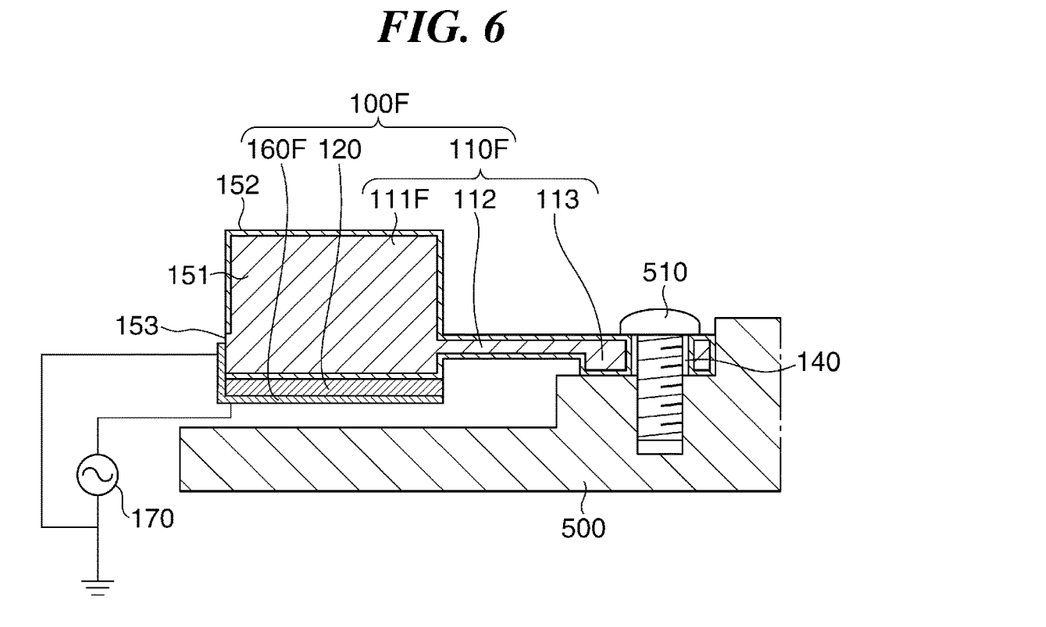
FIG. 6 is a cross-sectional view schematically showing a portion of a structure of a fifth variation of the vibrating body shown in FIG. 1, and a form in which a vibrating body according to the fifth variation is fixed to the base member.

FIG. 6 is a cross-sectional view showing a portion of a structure of a vibrating body 100F as a fifth variation of the vibrating body 100A of FIG. 1, and a form in which the vibrating body 100F is fixed to the base member 500. An elastic body 110F constructing the vibrating body 100F is a fifth variation of the elastic body 110A of FIG. 1.

A non-nitrided face 153 is formed at a part of an outer periphery of a vibration portion 111F of the elastic body 110F, where a non-nitrided portion of ferrous metal of the base material 151 is exposed. The non-nitrided face 153 can be formed by a method in which part of the outer periphery of the elastic body 110F is masked during the nitriding treatment of the elastic body 110F (base material 151), a method in which part of the outer periphery of the elastic body 110F is polished after the nitriding treatment so as to remove a nitrided layer, or the like.

A flexible printed board 160F is provided so as to extend to the outer periphery of the vibration portion 111F from a lower face of the piezoelectric device 120 of the vibrating body 100F while being folded at a lower end at the outer periphery side of the vibration portion 111F, and is bonded to the non-nitrided face 153. It should be noted that, insofar as the non-nitrided face 153 is formed at a position which the non-nitrided face 153 can be connected to the extending flexible printed board 160F, the position is not limited to the outer periphery of the vibration portion 111F.

The flexible printed board 160F includes a first wiring pattern (not shown) for applying a driving voltage to a driving electrode (not shown) of the piezoelectric device 120, and a second wiring pattern (not shown) for ground, both of which do not electrically connect to each other. The second wiring pattern for ground of the flexible printed board 160F is connected to the non-nitrided face 153 formed at the outer periphery of the vibration portion 111F, to thereby ground the vibrating body 100F.

An AC power supply 170 for supplying a driving voltage for driving the piezoelectric device 120 is connected to the wiring patterns provided at the flexible printed board 160F, where, because a contact face, where the elastic body 110F contacts to the second wiring pattern of the flexible printed board 160F, is a non-nitrided face 153, it is possible to reliably ground the elastic body 110F. By this means, the elastic body 110F can provide the same advantages as those of the elastic body 110A shown in FIG. 1.

It is also possible to employ a structure in which a rubber member (not shown) is disposed as an elastic member for damping unnecessary vibration caused at the vibrating body 100F, between the attachment portion 113 of the vibrating body 100F and the base member 500.

Even with such a structure, because the elastic body 110F (base material 151) is conducted to the base member 500 through the non-nitrided face 153 and the flexible printed board 160F with small electrical resistance, it is possible to reliably ground the elastic body 110F without going through the nitrided layer.

Seventh Embodiment

Figure 13A:
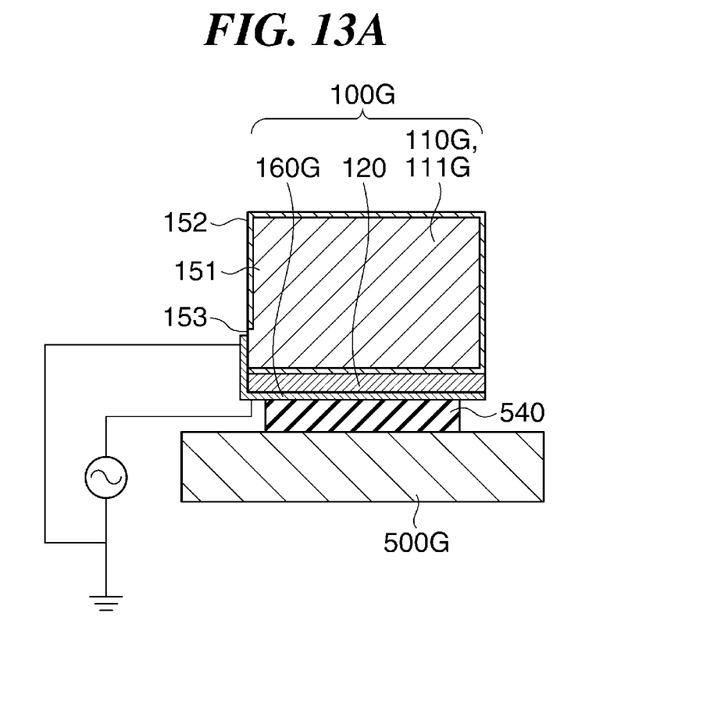
FIG. 13A is a cross-sectional view schematically showing a portion of a structure of a sixth variation of the vibration body shown in FIG. 1, and a form in which the vibration body according to the sixth variation is fixed to the base member.

FIG. 13A is a cross-sectional view showing a portion of a structure of the vibration body 100G as a sixth variation of the vibrating body 100A of FIG. 1, and a form in which the vibrating body 100G is fixed to a base member 500G. The elastic body 110G constructing the vibrating body 100G is a sixth variation of the elastic body 110A of FIG. 1.

The vibration body 100G comprises the elastic body 110G, a piezoelectric device 120, and a flexible printed board 160G. The elastic body 110G has a vibration portion 111G, and does not have constructions corresponding to the connection portion 112 or the attachment portion 113A of FIG. 1.

The vibration body 100G contacts the base member 500G via a vibration isolation member 540 comprising felt, or the like. The vibration body 100G is fixed by a rotation prevention member (not shown) in a rotation direction thereof. The vibration body 100G has circular shape, while defining a side where the flexible printed board 160G is folded, as an outer periphery side of the vibration body 100G.

A non-nitrided face 153 is formed at a part of an outer periphery of the vibration portion 111G of the elastic body 110G, where a non-nitrided portion of ferrous metal of a base material 151 is exposed. The non-nitrided face 153 can be formed by a method in which the part of the outer periphery of the elastic body 110G is masked during the nitriding treatment of the elastic body 110G (base material 151), a method in which the part of the outer periphery of the elastic body 110G is polished after the nitriding treatment so as to remove a nitrided layer, or the like.

A flexible printed board 160G is adapted so as to extend to the outer periphery of the vibration portion 111G from a lower face of the piezoelectric device 120 of the vibrating body 100G while being folded at a lower end at the outer periphery side of the vibration portion 111G, and is bonded to the non-nitrided face 153. It should be noted that, insofar as the non-nitrided face 153 is formed at a position which the non-nitrided face 153 can be connected to the extending flexible printed board 160G, the position is not limited to the outer periphery of the vibration portion 111G.

The flexible printed board 160G includes a first wiring pattern (not shown) for applying a driving voltage to a driving electrode (not shown) of the piezoelectric device 120, and a second wiring pattern (not shown) for ground, both of which do not electrically connect to each other. The second wiring pattern for ground of the flexible printed board 160G is connected to the non-nitrided face 153 formed at the outer periphery of the vibration portion 111G, to thereby ground the vibrating body 100G.

An AC power supply 170 for supplying a driving voltage for driving the piezoelectric device 120 is connected to the wiring patterns provided at the flexible printed board 160F, where, because a contact face, where the elastic body 110G contacts to the second wiring pattern of the flexible printed board 160G, is a non-nitrided face 153, it is possible to reliably ground the elastic body 110G. By this means, the elastic body 110G can provide the same advantages as those of the elastic body 110A shown in FIG. 1.

Figure 13B:
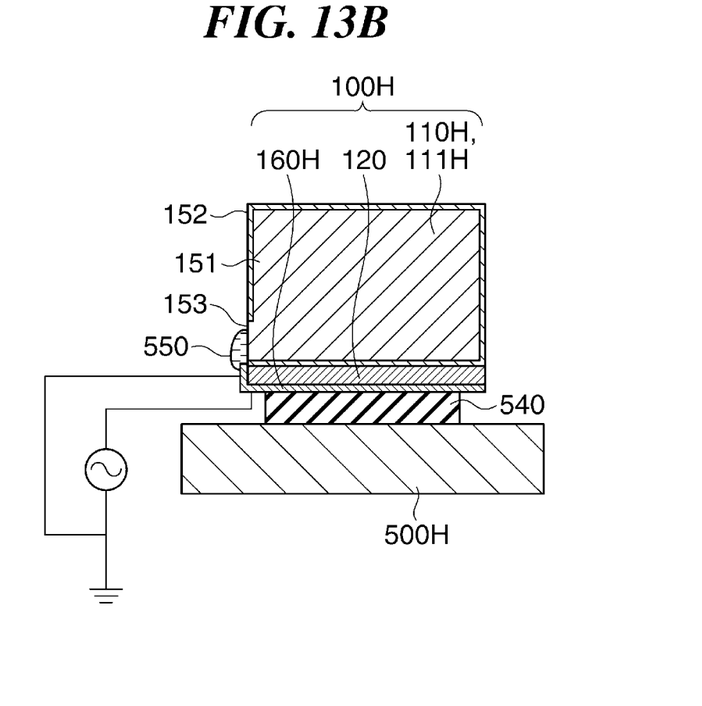
FIG. 13B is a cross-sectional view showing another example of the form of FIG. 13A, in which the vibrating body is fixed to the base member.

As shown in FIG. 13B, it is also possible to employ a structure in which the elastic body 110H is electrically grounded by conducting by using conductive paste 550 provided so as to connect the second wiring pattern for ground of the flexible printed board 160H and the non-nitrided face 153 with each other.

Figure 13C:
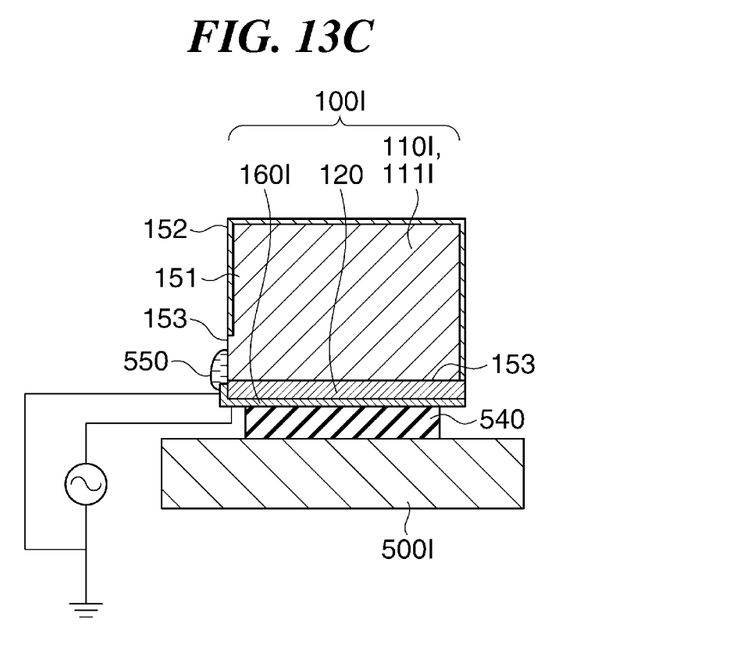
FIG. 13C is a cross-sectional view showing further another example of the form of FIG. 13A, in which the vibrating body is fixed to the base member.

Further, as shown in FIG. 13C, it is preferred that a contact face of the elastic body 110I contacting the piezoelectric device 120, is formed as a non-nitrided face 153 where nitrided layer 152 is not formed and a non-nitrided portion of ferrous metal of the base material 151 is exposed to the piezoelectric device 120. By this means, it is possible to stabilize bondability between the common electrode of the piezoelectric device 120 and the base material 150 of the elastic body 110I, which makes it possible to stably apply the driving voltage to the piezoelectric device 120.

Eighth Embodiment

In the eighth embodiment, a structure of an image forming apparatus will be described as an example of an apparatus provided having the vibration actuator according to the above-described embodiments of the present invention with reference to FIG. 10 to FIG. 12.

Figure 10:
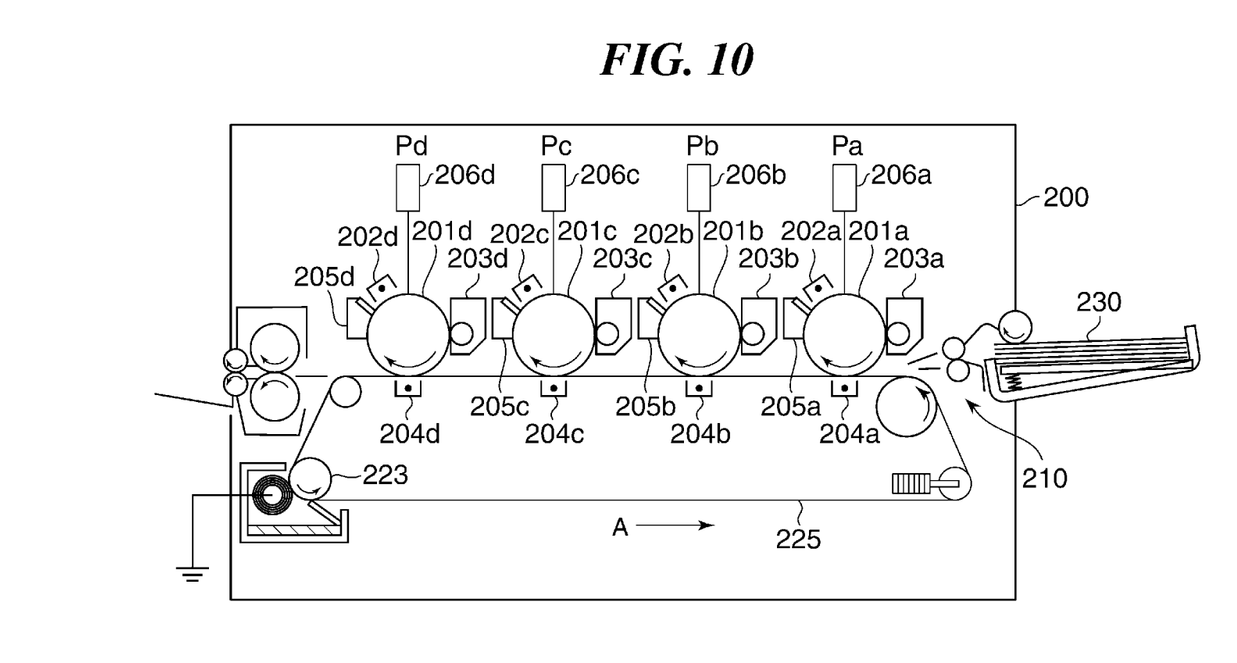
FIG. 10 is a cross-sectional side view showing an internal structure of a color image forming apparatus mounting the vibration actuator thereon, according to the embodiments of the present invention.

FIG. 10 is a cross-sectional side view showing an internal structure of a color image forming apparatus 200 mounting the vibration actuator thereon. The color image forming apparatus 200 includes four image forming units Pa, Pb, Pc and Pd; however, the number of image forming units is not limited to four.

The image forming units Pa to Pd have substantially the same structure, and respectively have photosensitive drums 201a, 201b, 201c and 201d as image carriers which are rotationally driven. The photosensitive drums 201a to 201d respectively have, therearound, charging units 202a, 202b, 202c and 202d for uniformly charging the photosensitive drums 201a to 201d.

Further, developing units 203a, 203b, 203c and 203d for developing electrostatic latent images formed on surfaces of the photosensitive drums 201a to 201d, charging units 204a, 204b, 204c and 204d for transferring the developed visual images to a transfer material 230, and cleaning units 205a, 205b, 205c and 205d for removing residual toner on the photosensitive drums 201a to 201d, are respectively and sequentially arranged around the photosensitive drums 201a to 201d in a rotation direction of the photosensitive drums 201a to 201d. Further, exposing devices 206a, 206b, 206c and 206d are respectively disposed above the photosensitive drums 201a to 201d.

A conveying unit comprises a conveying belt 225, a drive roller 223 and a feeding unit 210, and sequentially conveys transfer material 230 to the image forming units Pa to Pd. The conveying belt 225 is driven by the drive roller 223 in a direction of arrow A shown in FIG. 10, and carries the transfer material 230 fed through the feeding unit 210.

The vibration actuator according to the embodiments of the present invention is used as a drive motor for rotating the photosensitive drums 201a to 201d. Further, the vibration actuator according to the embodiments of the present invention is also used as a drive motor for rotating the drive roller 223 for driving the conveying belt 225.

Figure 11:
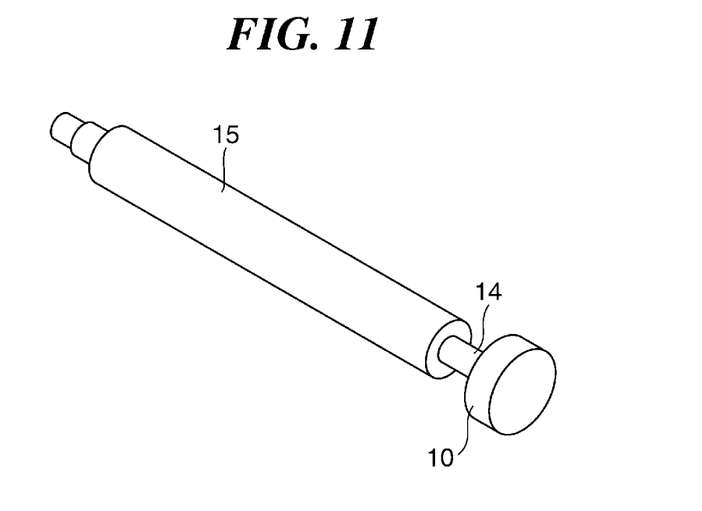
FIG. 11 is a perspective view schematically showing a structure in a case where the vibration actuator according to the embodiments of the present invention is mounted on the color image forming apparatus of FIG. 10 as a motor for driving photosensitive drums.

FIG. 11 is a perspective view schematically showing a structure in a case of the vibration actuator according to the embodiments of the present invention being mounted on the color image forming apparatus of FIG. 10 as a motor for driving photosensitive drums.

In FIG. 11, the vibration actuator 10 can be directly connected to a drive shaft 14 of a photosensitive drum 15 (corresponding to each of the photosensitive drums 201a to 201d). Therefore, it is not necessary to use a decelerating unit such as a gear as is distinct from the conventional apparatus, and it is possible to reduce color drift to thereby improve printing quality.

Figure 12:
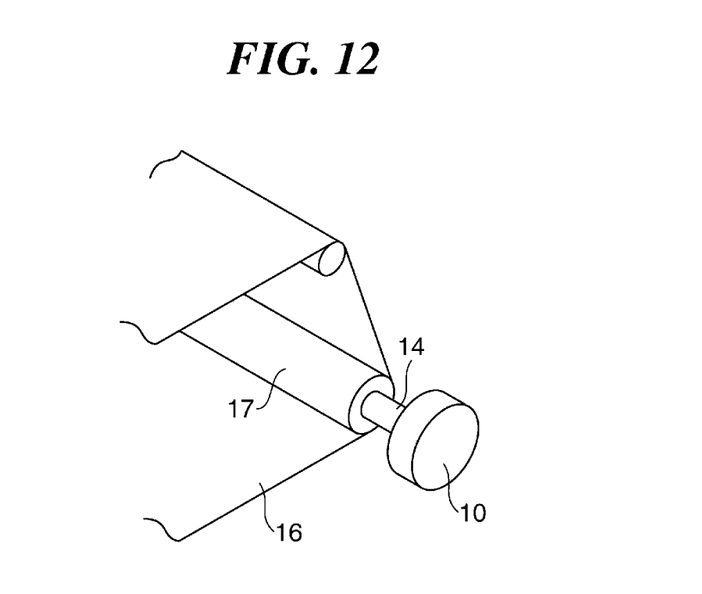
FIG. 12 is a perspective view schematically showing a structure in a case where the vibration actuator according to the embodiments of the present invention is mounted on the color image forming apparatus of FIG. 10 as a motor for driving a conveying belt.

FIG. 12 is a perspective view schematically showing a structure in a case of the vibration actuator according to the embodiments of the present invention being mounted on the color image forming apparatus of FIG. 10 as a motor for driving a conveying belt.

In FIG. 12, the vibration actuator 10 can be directly connected to a drive shaft 14 of a drive roller 17 (corresponding to the drive roller 223). Therefore, in a case where the vibration actuator is mounted as a motor for driving the conveying belt 16, it is also possible to improve printing quality.

OTHER EMBODIMENTS

While the present invention has been described in detail above with reference to preferred embodiments, the present invention is not limited to these specific embodiments and includes various forms within the gist of the invention. Further, each of the above-described embodiments is merely one embodiment of the present invention, and the embodiments can be combined appropriately.

For example, as with the above-described elastic body 110B, it is also possible to form a non-nitrided face on each of faces of the elastic bodies 110C to 110G contacting the piezoelectric device 120, form a plurality of grooves 131 and a plurality of protrusions 130 on a friction face which contacts the moving body 180 which is a driven member, and form a non-nitrided face on a bottom of the grooves 131.

This application claims the benefit of Japanese Patent Application No. 2014-082001, filed Apr. 11, 2014, and No. 2015-077931, filed Apr. 6, 2015, which are hereby incorporated by reference herein in their entireties.

What is claimed is:

1. A vibration actuator, comprising:
a vibrating body comprising:

an elastic body including a ferrous metal, and
an electro-mechanical energy conversion device bonded to the elastic body; and
a driven member in frictional contact with the vibrating body and moving relatively with respect to the vibrating body,
wherein the elastic body comprises:
a nitrided layer including a nitride of the ferrous metal, the nitrided layer being in contact with the driven member, and
a non-covered portion where the nitrided layer is not formed, and
wherein the elastic body is electrically grounded through the non-covered portion.

2. The vibration actuator according to claim 1, wherein the driven member moves relatively with respect to the vibrating body by vibration excited at the vibrating body due to application of an AC voltage to the electro-mechanical energy conversion device.

3. The vibration actuator according to claim 1, further comprising a base member electrically grounded,
wherein the elastic body is electrically grounded through the base member.

4. The vibration actuator according to claim 3,
wherein the non-covered portion is in direct contact with the base member, and
wherein the non-covered portion is electrically grounded through the base member.

5. The vibration actuator according to claim 3, further comprising a fixing screw including a conductive material and adapted to fix the elastic body to the base member,
wherein the non-covered portion is in direct contact with the fixing screw,
wherein the fixing screw is fixed to the base member, and
wherein the elastic body is electrically grounded through the fixing screw and the base member.

6. The vibration actuator according to claim 1, wherein the elastic body further comprises a second non-covered portion where the nitrided layer is not formed at a contact face of the elastic body, contacting the electro-mechanical energy conversion device.

7. The vibration actuator according to claim 1, wherein the elastic body has a plurality of protrusions in contact with the driven member, and at a bottom of a groove between two of the plurality of protrusions, the ferrous metal is not nitrided and is exposed.

8. The vibration actuator according to claim 1, further comprising a flexible printed board bonded to the electro-mechanical energy conversion device,
wherein the flexible printed board comprises a first wiring for applying a driving voltage to the electro-mechanical energy conversion device and a second wiring for grounding the electro-mechanical energy conversion device, and
wherein the second wiring is electrically connected to the non-covered portion.

9. The vibration actuator according to claim 1, further comprising an elastic member disposed between the elastic body and the base member.

10. The vibration actuator according to claim 1, wherein a compound layer is formed in the vicinity of a surface layer of the nitrided layer.

11. An image forming apparatus comprising:
an image carrier;
a conveying belt disposed so as to face the image carrier; and
the vibration actuator according to claim 1, adapted to rotationally drive the image carrier.

12. An image forming apparatus comprising:
an image carrier;
a conveying belt disposed so as to face the image carrier; and
the vibration actuator according to claim 1, adapted to drive the conveying belt.

13. The vibration actuator according to claim 1, wherein the ferrous metal is stainless steel.

14. The vibration actuator according to claim 4, wherein the non-covered portion is provided on an opposite side of a face of the elastic body, on which the nitrided layer contacting with the driven member is formed.

15. The vibration actuator according to claim 1, wherein surface roughness of the non-covered portion is smaller than surface roughness of a surface of the nitrided layer excluding a part of the surface which contacts with the driven member.

16. The vibration actuator according to claim 1, wherein surface hardness of the non-covered portion is smaller than surface hardness of the nitrided layer.

17. The vibration actuator according to claim 6, wherein surface roughness of the second non-covered portion is smaller than surface roughness of a surface of the nitrided layer except a part of the surface which contacts with the driven member.

* * * * *